(12) United States Patent
Nakajima et al.

(10) Patent No.: US 6,217,730 B1
(45) Date of Patent: Apr. 17, 2001

(54) SPUTTERING DEVICE

(75) Inventors: Kuniaki Nakajima; Tomoyasu Kondo, both of Chigasaki; Tsuyoshi Sahoda, Chiba; Yasushi Higuchi, Chiba; Takashi Komatsu, Chiba, all of (JP)

(73) Assignee: Nihon Shinku Gijutsu Kabushiki Kaisha, Kanagawa (JP)

( * ) Notice: Subject to any disclaimer, the term of this patent is extended or adjusted under 35 U.S.C. 154(b) by 0 days.

(21) Appl. No.: 09/548,601

(22) Filed: Apr. 13, 2000

(30) Foreign Application Priority Data

Apr. 15, 1999 (JP) .................................................. 11-107335

(51) Int. Cl.$^7$ ............................. C23C 14/34; C23C 14/35
(52) U.S. Cl. ............................. 204/298.11; 204/298.11; 204/298.07; 204/298.23; 204/298.26; 204/298.28; 204/298.12; 204/298.17; 204/298.18
(58) Field of Search .................... 204/298.11, 298.07, 204/298.23, 298.26, 298.28, 298.12, 298.17, 298.18

(56) References Cited

U.S. PATENT DOCUMENTS 3,864,239 * 2/1975 Fletcher et al. ................. 204/298.11
5,792,324 * 8/1998 Seon .............................. 204/298.07
6,051,113 * 4/2000 Moslehi .......................... 204/298.23

FOREIGN PATENT DOCUMENTS 0 837 491   4/1998  (EP) .
6-172974    6/1994  (JP) .
94/19508  * 9/1994  (WO) ......................... 204/192.15

* cited by examiner

Primary Examiner—Mark F. Huff
Assistant Examiner—Daborah Chacko-Davis
(74) Attorney, Agent, or Firm—Armstrong, Westerman, Hattori, McLeland & Naughton, LLP

(57) ABSTRACT

A sputtering device enabling a small incident angle. A plurality of shield plates provided with holes at the same positions as targets are arranged in a vacuum chamber. Sputtering particles ejected diagonally from the targets $5_1$–$5_9$ become attached to the shield plates 21–23 and only particles ejected vertically reach the surface of a substrate 12. As a result, it is possible to uniformly form a thin film inside microscopic holes of high aspect ratio. If sputtering gas is introduced close to the targets $5_1$–$5_9$, reactant gas is introduced close to the substrate 12 and evacuation carried out close to the substrate 12, reactant gas does not reach the targets $5_1$–$5_9$ side. Consequently, it is possible to prevent deterioration of the surfaces of the targets $5_1$–$5_9$.

11 Claims, 7 Drawing Sheets

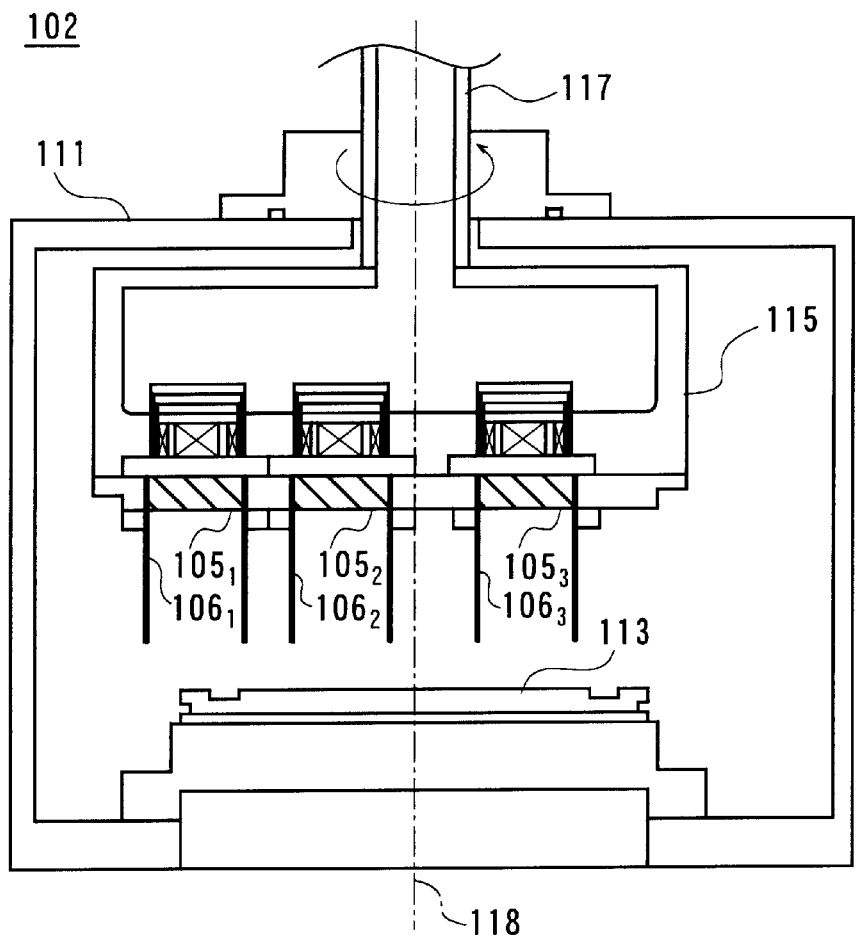
Fig.10 (a) Prior art
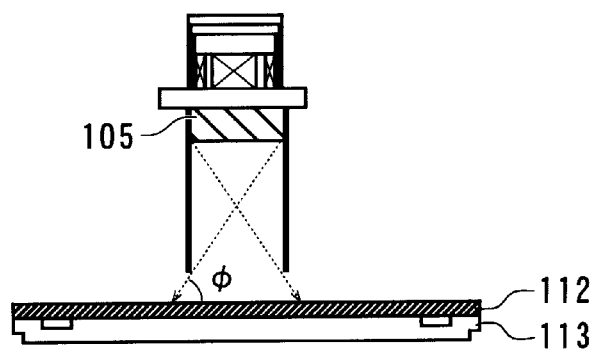
Fig.10 (b) Prior art

SPUTTERING DEVICE

BACKGROUND OF THE INVENTION

1. Technical Field

The present invention relates to the technical field of sputtering devices, and particularly to a multiple cathode sputtering device.

2. Related Art

A sputtering device is widely used in the field of semiconductor devices and liquid crystal display devices to form metallic thin films and insulation films.

Reference numeral 102 in FIG. 10($a$) shows an example of a sputtering device.

This sputtering device 102 has a vacuum chamber 111, with a substrate holder 113 arranged on the bottom of the vacuum chamber 111, and a target holder 115 arranged close to the ceiling of the vacuum chamber 111 at a position above the substrate holder 113. A plurality of cylindrical shield tubes 106 are provided on a substrate holder 113 side surface of the target holder 115 (in this drawing three shield tubes $106_1$–$106_3$ are shown).

Targets $105_1$–$105_3$ are arranged one each inside the shield tubes $106_1$–$106_3$, and when a substrate on which a film is to be formed is placed on the substrate holder 113 the substrate and each of the targets 115 face each other.

When sputtering is carried out with this sputtering device 102, among particles ejected from the each of the targets $105_1$–$105_3$, those that are ejected diagonally become deposited to the shield tube 106, and only particles that fly out vertically can pass through the shield tube 106.

Reference numeral 112 in FIG. 10($b$) represents as substrate mounted on the substrate holder 113, and if sputtering particles that have passed through the shield tube 106 are incident on the substrate 112, an angle formed by those sputtering particles and the surface of the substrate 112 becomes a minimum of $\phi$(incident angle is $\pi/2-\phi$). When the particles are incident at this angle $\phi$, the incident angle of the sputtering particles becomes maximum.

A rotating shaft 117 is attached to a rear surface of the target holder 115. The rotating shaft 117 is airtightly lead through to the outside of the vacuum chamber 111. Rotation of the rotating shaft 117 causes rotation of the target holder 115, and each of the targets $105_1$–$105_3$ can be horizontally rotated parallel to the substrate holder 113. Reference numeral 118 represents the rotational axis of the rotating shaft 117.

With this type of sputtering device 102, if sputtering is carried out while rotating the target holder 115, a thin film is uniformly formed on the surface of the substrate 112 with a small incident angle of the sputtering particles to the surface of the substrate 112. Accordingly, uniform film formation is also possible inside microscopic holes having a high aspect ratio.

However, since sputtering particles deposit to the inner walls of the shield tubes $106_1$–$106_3$, a thin film is also formed at this section, and a problem occurs in that this film breaks up into smallness dust. Also, even if surface treatment to prevent smallness dust being generated is performed on the inner wall surfaces of the shield tubes $106_1$–$106_3$, it is difficult to insert a spray gun inside the tube.

Also, when reactive sputtering is carried out, not only sputtering gas but also reactant gas infiltrates into the shield tubes $106_1$–$106_3$, which causes problems such as a metallic target surface being nitrided (for example, TiN being formed on a Ti target surface), a reduction in sputter yield, and lowering of film deposition rate.

SUMMARY OF THE INVENTION

The present invention has been conceived in view of the above described drawbacks, and an object of the present invention is to provide a sputtering device that enables a small incident angle without using a cylindrical shield.

In order to achieve the above described object, a first aspect of the present invention is a sputtering device comprising, a vacuum chamber, a substrate holder arranged inside the vacuum chamber for holding a substrate, a plurality of targets arranged with surfaces opposite a substrate on the substrate holder, and a plurality of shield plates provided with a plurality of holes and arranged parallel to each other between the substrate holder and each of the targets, with spaces maintained between the shield plates.

With the present invention, each of the targets can be made to face the substrate holder through holes in each of the shield plates.

In such a case, it is possible for a normal line perpendicular to the surface of each target to pass through the holes in each shield plate and reach the surface of the substrate arranged on the substrate holder. At least the normal line in the center of the target which is perpendicular to the surface of each target, or the normal line in the center of the cathode electrode which is perpendicular to the surface of each cathode electrode, passes through the holes in each shield plate. These normal lines reach the surface of the substrate arranged on the substrate holder perpendicularly.

It is possible to arrange each target above the substrate holder. In such a case, thin film deposited to each shield plate does not fall off.

Also, it is possible for the sputtering device of the present invention to be configured so that each of the targets and each of the shield plates are rotated relative to the substrate holder while being stationary with respect to each other.

In this case, it is possible to rotate the target and each shield plate with the substrate stationary with respect to the vacuum chamber. On the other hand, it is also possible to rotate the substrate with the target and each shield plate stationary with respect to the vacuum chamber.

It is possible to fix each target to the same target holder.

With the sputtering device of the present invention, it is also possible to provide a first gas inlet, for introducing sputtering gas, and a second gas inlet, for introducing reactant gas, in the vacuum chamber.

In this case, it is possible to arrange the first gas inlet closer to the target than the second gas inlet.

Also in this case, it is possible for sputtering gas introduced into the vacuum chamber from the first gas inlet to be introduced between the target and a shield plate closest to the target, and for reactant gas introduced from the second gas inlet to be introduced between the substrate holder and the shield plate closest to the substrate holder.

The sputtering device of the present invention can further comprise a stick preventive tube arranged between the substrate holder and the target, having one opening section facing the substrate holder side, and another opening section facing the target side, with each of the shield plates being arranged inside the stick preventive tube.

In this case, each shield plate can be removably attached to the stick preventive tube.

It is also possible to have a shield ring arranged at an outer portion of the stick preventive tube, with a space inside the vacuum chamber being partitioned into a target side and a substrate holder side by the shield ring and the shield plates.

Also, when the first and second gas inlets are provided, it is possible to provide the first gas inlet for introducing sputtering gas into the vacuum chamber on the target side of the vacuum chamber, and to provide the second gas inlet for introducing reactant gas into the vacuum chamber on a substrate holder side of the vacuum chamber.

With the above described structure, the present invention has a substrate holder located inside a vacuum chamber, and a plurality of targets arranged at a position opposite the substrate holder.

A plurality of shield plates are arranged between the substrate holder and the target. Each shield plate is arranged so as to be substantially parallel to a substrate arranged on the substrate holder. The shield plates are arranged with spaces between them.

Holes are respectively provided in each shield plate at positions opposite to each target (that is, on a normal line of the surface of each target), and each target is configured so as to face the substrate holder through the holes.

With such structural arrangement, in the case where a target has a plate shape, among sputtering particles flying off from each target, those that are ejected vertically or at an angle close pass through the holes in the shield plate and reach the surface of a substrate mounted on the substrate holder. The incident angle of these type of sputtering particles to the substrate surface is small.

On the contrary, sputtering particles that are ejected diagonally with respect to the target surface stray from the holes and are intercepted by the shield plates, becoming deposited to the surface of the shield plates. Accordingly, these type of sputtering particles cannot reach the substrate, and thus, since only sputtering particles having a small incident angle are incident on the substrate, it becomes possible to form a thin film inside microscopic holes of high aspect ration and microscopic grooves.

With a structure where the substrate mounted on the substrate holder and the targets are rotated with respect to each other while being parallel to one another, it becomes possible to form a thin film uniformly over the whole of the effective region of the substrate surface.

If a stick preventive tube is attached to the target holder provided with a target and sputtering is carried out inside the stick preventive tube, sputtering particles do not become deposited to the vacuum chamber. If the shield plates are removably attached to the stick preventive tube, cleaning is made easy.

By using a shield plate instead of a shield tube, it is possible to provide a gap between the target or the target holder and a shield plate closest to the target. In this case, if sputtering gas is introduced from a position closer to the target than the substrate, reactant gas is introduced from a position close to the substrate and evacuation is carried out from a position close to the substrate, the target is not exposed to reactant gas which means that the target surface does not deteriorate.

In this case, if the space inside the vacuum chamber is divided up into a target side and a substrate holder side by a shield ring or shield plate provided on the stick preventive tube, deterioration of the target surface can be prevented much more reliably.

BRIEF DESCRIPTION OF THE DRAWINGS

FIG. 10($a$) is a drawing for describing an example of a sputtering device of prior art.

FIG. 10($b$) is a drawing for describing sputtering particle incidence of this sputtering device.

DETAILED DESCRIPTION OF THE PREFERRED EMBODIMENT

Embodiments of the present invention will now be described with reference to the drawings.

Figure 1:
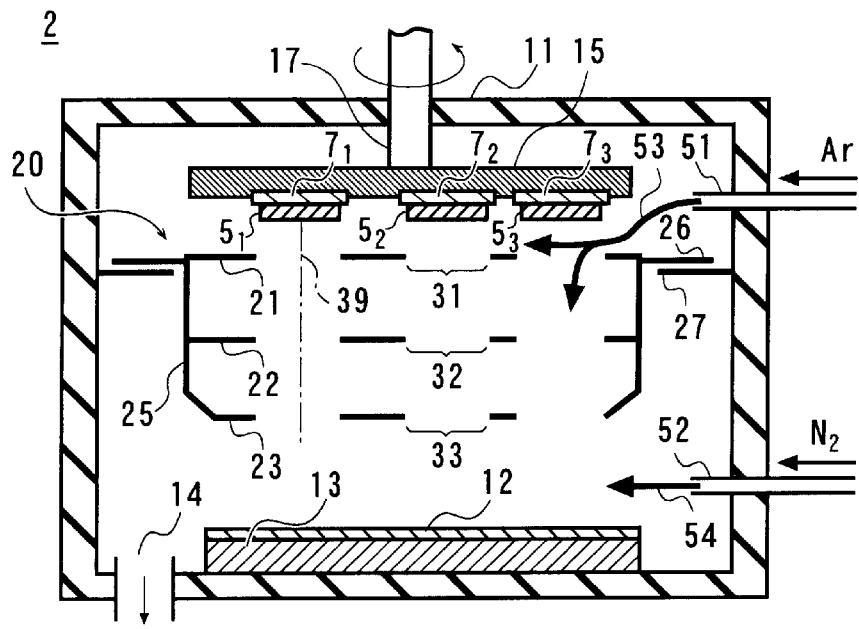
FIG. 1 is a drawing for describing one example of a sputtering device of the present invention.

Referring to FIG. 1, reference numeral 2 represents a sputtering device of one example of the present invention. This sputtering device 2 has a vacuum chamber 11.

A substrate holder 13 is arranged horizontally on the bottom of the vacuum chamber 11, and a target holder 15 is arranged horizontally at a position above this substrate holder 13, namely on the ceiling of the vacuum chamber 11. Reference numerals $7_1$–$7_9$ represent nine cathode electrodes in FIG. 3. Each of the cathode electrodes $7_1$–$7_9$ is provided on a surface of the target holder 15 facing the substrate holder 13, and targets $5_1$–$5_9$ are arranged one each on each of the cathode electrodes $7_1$–$7_9$. Sections shown in FIG. 1 and FIG. 2 correspond to a cross section along line A—A in FIG. 3, and three cathode electrodes $7_1$–$7_3$ and three targets $5_1$–$5_3$ are shown.

A plurality of struts are attached vertically to peripheral sections of the target holder (the struts are not shown in the drawing), and a shield assembly 20 is attached to lower ends of the struts.

The shield assembly 20 comprises a cylindrical stick preventive tube 25, and first to third disc-like shield plates 21, 22 and 23.

The stick preventive tube 25 is formed having roughly the same diameter as the target holder 15, and is arranged between the substrate holder 13 and the target holder 15 so that one opening section faces the substrate holder 13, and another opening section faces the target holder 15. The first shield plate 21 and the third shield plate 23 are respectively arranged above and below the stick preventive tube 25, and are attached so as to block off the opening sections of the stick preventive tube 25. The second shield plate 22 is arranged at a central position inside the stick preventive tube 25, and is attached by gluing outer edges to the inner wall surfaces of the stick preventive tube 25. The same number of holes as the number of targets $5_1$ 1 $5_9$ are respectively formed in the first to third shield plates 21–23. The plurality of holes formed in the first to third shield plates 21–23 are respectively represented by reference numerals 31, 32 and 33.

Figure 4:
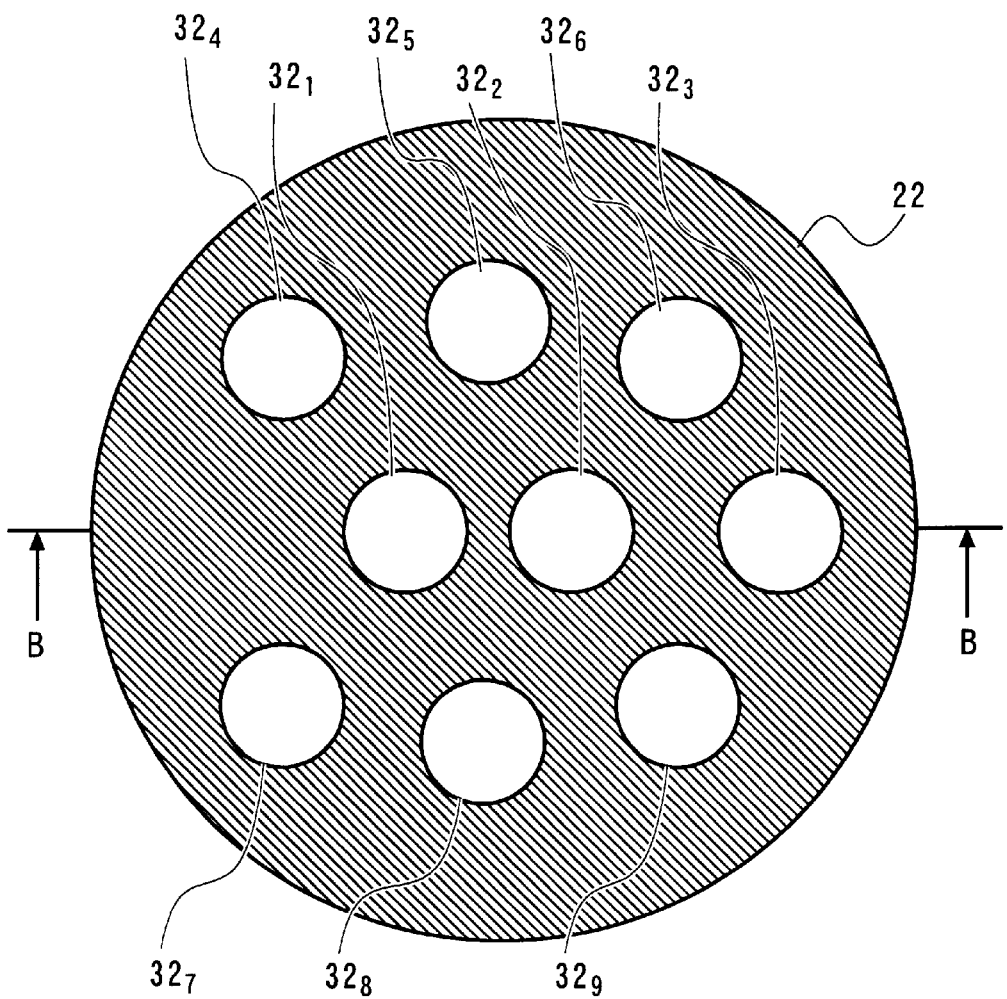
FIG. 4 is a drawing for describing the arrangement of holes formed in a shield plate.

Reference numerals $32_1$–$32_9$ represent nine holes formed in the second shield plate 22 shown in FIG. 4. The relative positions of each of the holes $32_1$–$32_9$ are made the same as the relative positions between the targets $5_1$–$5_9$. Similarly, relative positions of holes 31 provided in the first shield plate 21 and relative positions of holes 33 provided in the third shield plate 23 are also made the same as the relative positions between the targets $5_1$–$5_9$.

The first to third shield plates 21–23 are parallel to the substrate holder 13 and the targets $5_1$–$5_9$, and the holes 31, 32 and 33 of each of the shield plates 21–23 are arranged so as to be located above a normal line of the targets $5_1$–$5_9$. Accordingly, each of the targets $5_1$–$5_9$ are made to face parallel to the substrate holder 13 through the holes 31–33 of the first to third shield plates 21–23. Reference numeral 39 in FIG. 1 represents one normal line of the target $5_1$ at the left side of the drawing.

Figure 3:
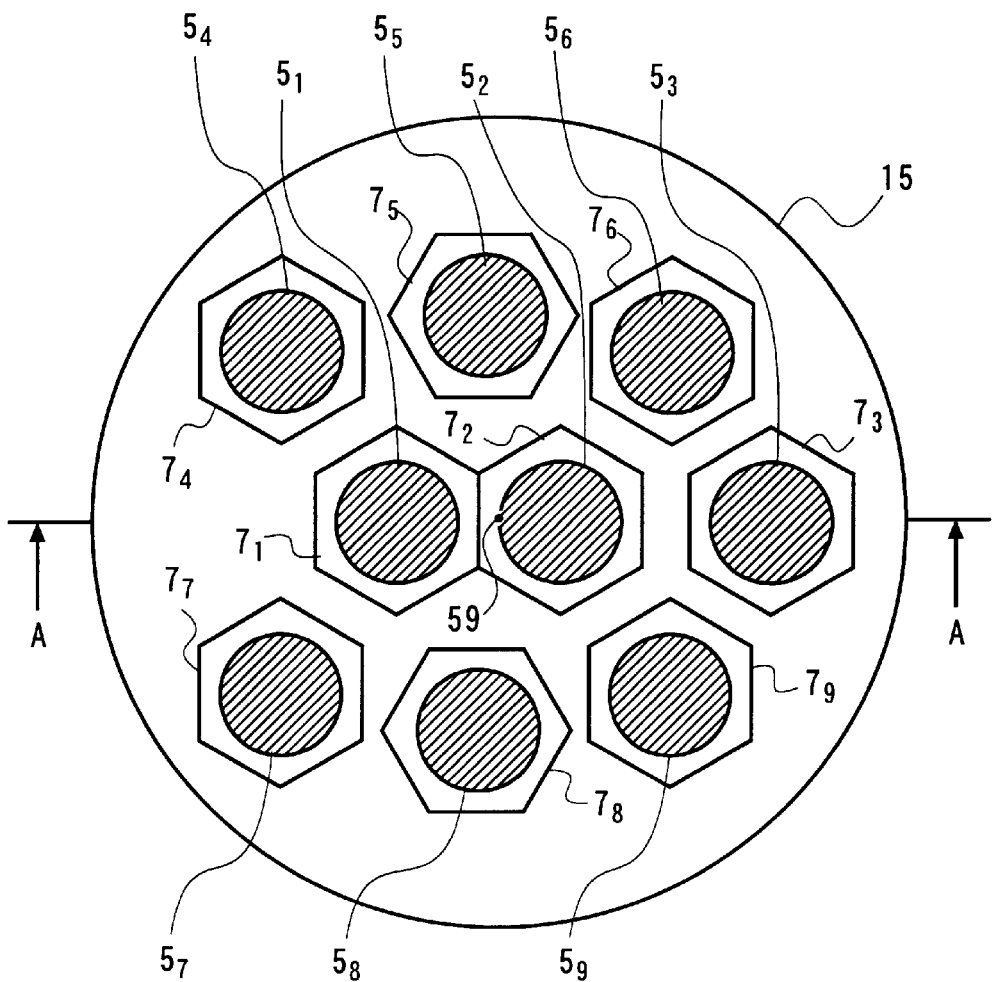
FIG. 3 is a drawing for describing the arrangement of a target and a cathode electrode.

A rotating shaft 17 is attached vertically to the rear surface of the target holder 15, and airtightly leads to the outside of the vacuum chamber 11. If the rotating shaft 17 is caused to rotate, the target holder 15 is caused to rotate horizontally while maintaining the vacuum atmosphere inside the vacuum chamber 11. Reference numeral 59 in FIG. 3 represents a central point of the target holder 15, and each of the targets $5_1$–$5_9$ rotates horizontally around this central point 59.

If the target holder 15 rotates, the cathode electrodes $7_1$–$7_9$, the targets $5_1$–$5_9$ and the shield assembly 20 rotate together, and each of the targets $5_1$–$5_9$ rotates while facing the substrate holder 13 through the holes 31–33.

A first shield ring 26 is provided at an upper outer part of the stick preventive tube 25, and a second shield ring 27 r is provided on a wall surface of the vacuum chamber 11 close to an upper end of the shield assembly 20. As a result, the space between the stick preventive tube 25 and the wall surface of the vacuum chamber 11 is separated top and bottom by the first shield plate 21 and the first and second shield rings 26 and 27. The first and second shield rings 26 and 27 are out of contact state, and do not rub against each other even if the stick preventive tube 25 rotates.

In a part of the inside of the vacuum chamber 11 that is partitioned by the first shield plate 21 and the first and second shield rings 26 and 27, a sputtering gas inlet (first gas inlet) 15 is provided on a side wall surface of the vacuum chamber 11 positioned on the target holder 15 side, and a reactant gas inlet (second gas inlet) 52 and an exhaust vent 14 are provided on a substrate holder 13 side wall surface (or bottom surface).

The case where a TiN thin film is formed using this type of sputtering device 2 will now be described. Each of the targets $5_1$–$5_9$ is Ti metal.

Figure 2:
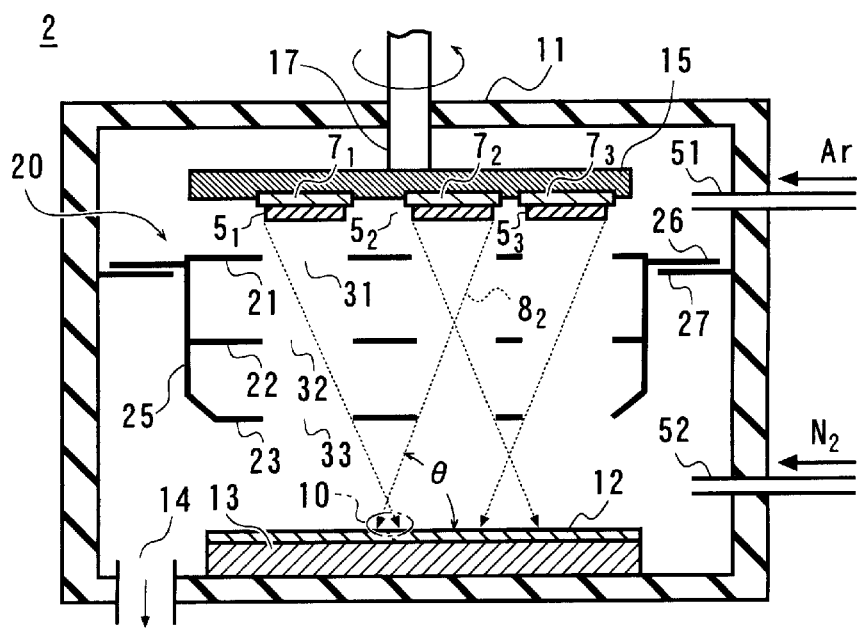
FIG. 2 is a drawing for describing an incident state of sputtering particles of this sputtering device.

First of all, a vacuum pump is activated to evacuate the inside of the vacuum chamber 11 from the exhaust vent 14, and a substrate is carried in while maintaining the vacuum atmosphere and mounted on the substrate holder 13. Reference numeral 12 in FIG. 1 and FIG. 2 represents the substrate in this state.

The rotating shaft 17 is caused to rotate at the same time as introducing Ar gas from the sputtering gas inlet 51 and introducing $N_2$ gas from the reactant gas inlet 52. The arrows shown by reference numeral 53 in FIG. 1 show the direction of flow of the Ar gas, while the arrows shown by reference numeral 54 show the flow direction of the $N_2$ gas.

Ar gas is introduced close to the targets $5_1$–$5_9$, and since the Ar gas is exhausted to the outside of the vacuum chamber 11 through the holes 31–33 of the first to third shield plates 21–23, the area around the targets $5_1$–$5_9$ becomes an Ar gas atmosphere.

On the other hand, $N_2$ gas is introduced close to the substrate 12 and does not flow to the targets $5_1$–$5_9$ side due to exhaust from the exhaust vent 14.

The vacuum chamber 11, stick preventive tube 25, first to third shield plates 21–23, and the first and second shield rings 26 and 27 are made of metal (stainless steel:SUS304), and are set at ground potential.

After Ar gas and $N_2$ gas have been introduced and the pressure inside the vacuum chamber 11 stabilized, a voltage is applied to the cathode electrodes $7_1$–$7_9$ to generate a mainly argon gas plasma at the surface of the targets $5_1$–$5_9$, and sputtering is carried out on the surfaces of the targets $5_1$–$5_9$.

Among the Ti particles (Ti atoms and clusters of Ti atoms) ejected from the surfaces of the targets $5_1$–$5_9$, those that ejected vertically from the surfaces of the targets $5_1$–$5_9$ pass through the holes 31–33 in the first to third shield plates 21–23 and reach the surface of the substrate 12. The surface of the substrate 12 is in an atmosphere containing $N_2$ gas and the Ti particles react with the $N_2$ gas on the surface of the substrate 12 to grow a TiN thin film.

On the other hand, Ti particles that are ejected diagonally from the surfaces of the targets $5_1$–$5_9$ are deposited to the surfaces of the shield plates 21–23 and do not reach the surface of the substrate 12.

The dotted lines shown by numeral $8_2$ in FIG. 2 show the locus of Ti particles ejected form the ends of the target $5_2$ skimming over the opposite end of hole 33 and incident on the surface of the substrate 12. The incident angle of these Ti particles become largest.

The reference mark θ shows an angle of locus these Ti particles with the surface of the substrate 12. This angle θ is equal to equation: π/2-(incident angle). In this case, the incident angle of these Ti particles referenced numeral $8_2$ is the largest, so that the angle θ of these Ti particles is the smallest.

There are no targets $5_1$–$5_9$ arranged above a vertical axis of a region of the substrate 12 shown by reference numeral 10, and the holes 31–33 of the shield plates 21–23 are not disposed, but Ti particles ejected from at least two adjacent targets $5_1$–$5_2$ are incident at the region 10.

Each of the targets $5_1$–$5_9$ are rotated together with the shield plates 21–23, which means that with one rotation of the targets $5_1$–$5_9$ a large portion of the surface of the substrate 12 is opposite the targets $5_1$–$5_9$ at least once, and a TiN thin film is grown uniformly on the surface of the substrate 12.

A distance between the centers of each of the targets $5_1$–$5_9$ and the centers of the target holders 15 in this sputtering device 2, and the number of targets arranged at this distance, is shown in table 1 below.

TABLE 1

| Distance | 23 mm | 50 mm | 75 mm | 80 mm | 100 mm | 120 mm |
| --- | --- | --- | --- | --- | --- | --- |
| Number of targets | 1 | 1 | 1 | 1 | 2 | 3 |
| Input power | 150 | 323 | 150 | 315 | 225 | 195 |

The diameter of a substrate used is 200 mm, the diameter of the targets $5_1$–$5_9$ is 50 mm, and a distance between the targets $5_1$–$5_9$ and the substrate 12 is 150 mm. Also, distances between the targets $5_1$–$5_9$ and the first to third shield plates 21–23 are respectively set to 35 mm, 65 mm and 110 mm.

With the sputtering device 2 of the present invention, since the incident angle of the Ti particles is small (the angle θ in FIG. 2 is large), it is possible to form a TiN thin film inside microscopic holes of high aspect ratio. Also, since the targets $5_1$–$5_9$ are made to rotate, it becomes possible to form a TiN thin film on the surface of the substrate 12 with a film thickness distribution of ±3.2%.

Figure 5:
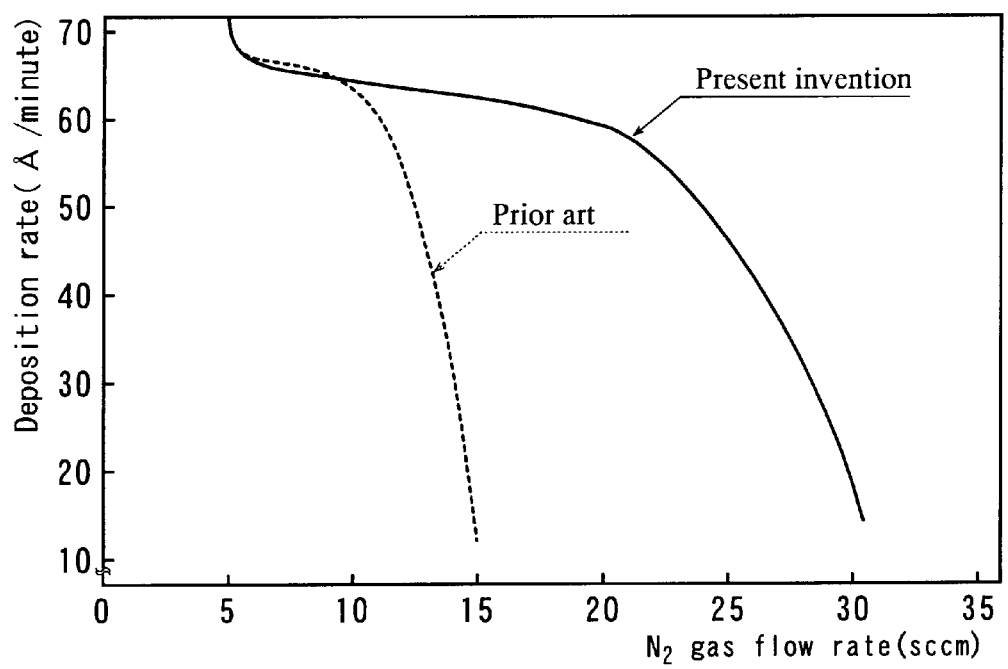
FIG. 5 is a graph showing a relationship between $N_2$ gas flow and deposition rate.

Using this sputtering device 2 and setting the Ar gas flow rate to about 15 sccm, with input power to each of the targets $5_1$–$5_9$ as shown in table 1 above, TiN thin films were formed varying the flow rate of $N_2$ gas. The results are shown by the solid line in the graph of FIG. 5. It will be understood from this graph that deposition rate is not lowered even if the flow rate of N2 gas is increased.

By comparison, in the sputtering device 102 shown in FIG. 10(a), a TiN thin film was formed by introducing a mixture of Ar gas and $N_2$ gas. The results are shown by the dotted line in the graph of FIG. 5. With the sputtering device 102 shown in FIG. 10(a), it will be understood that if the amount of $N_2$ gas introduced is increased, the deposition rates decreases rapidly.

Figure 6:
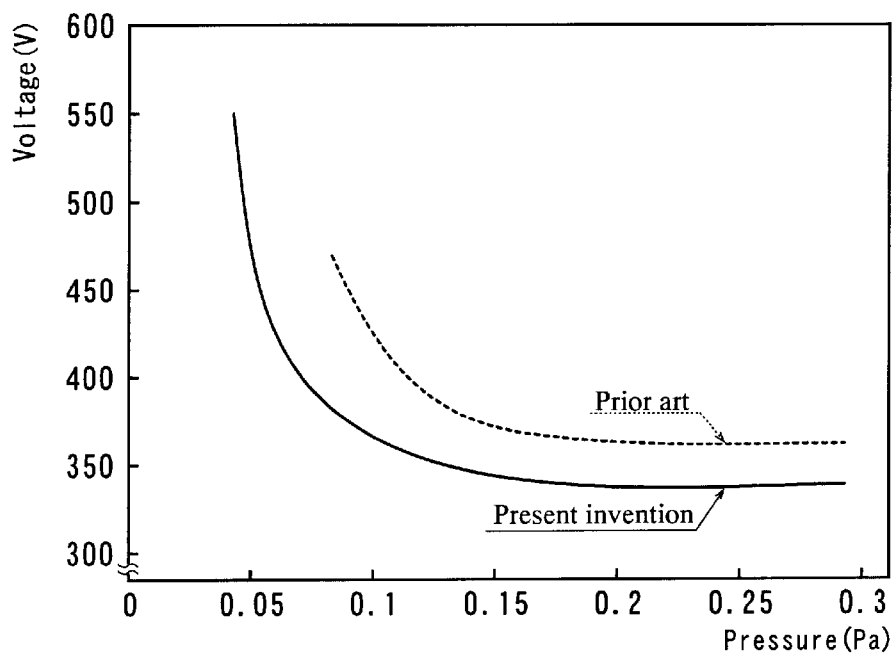
FIG. 6 is a graph showing a relationship between pressure inside a vacuum chamber and voltage sustaining stable discharge in the pressure.

Next, FIG. 6 is a graph showing a relationship between internal pressure of the vacuum chamber 11 and voltage sustaining stable discharge in the pressure, and the solid line in FIG. 6 is for the sputtering device of the present device. The dotted line in FIG. 6 is for the case of the sputtering device 102 shown in FIG. 10(a).

It will be understood from the graph of FIG. 6 that with the sputtering device 2 of the present invention, since argon gas is effectively introduced to the surfaces of the targets $5_1-5_9$, electric discharge at low pressure is possible.

Figure 7:
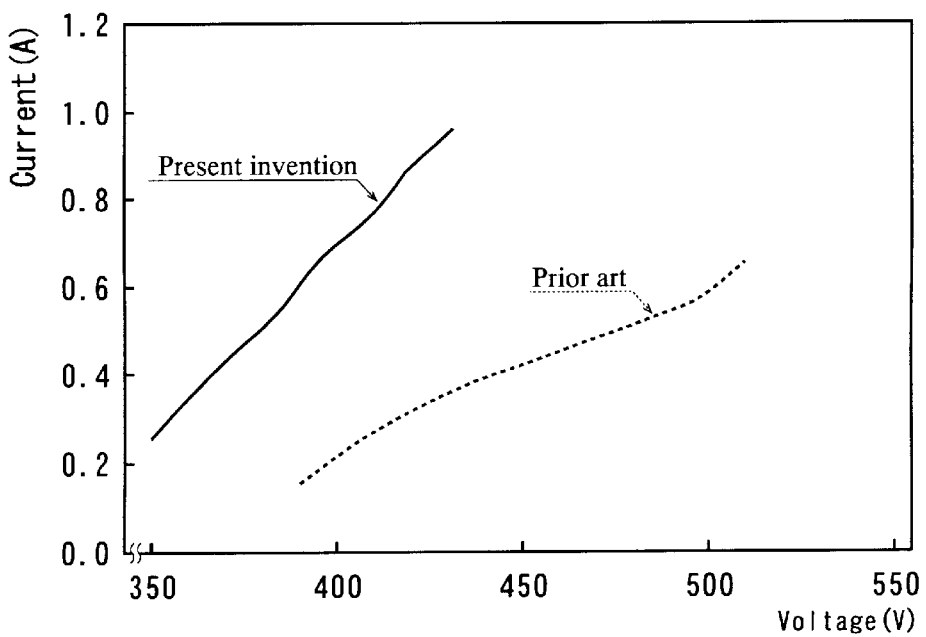
FIG. 7 is a graph showing the relationship between voltage applied to the target and current flowing to the target.

Also, FIG. 7 is a graph showing a relationship between voltage applied to the targets $5_1-5_9$ and current flowing to the targets, with the solid line showing the case of the sputtering device 2 of the present invention and the dotted line showing the case of the sputtering device 102 shown in FIG. 10(a).

From the graph of FIG. 7, it will be understood that the cathode electrode resistance is lower with the present invention, and electric discharge is stable.

Figure 8:
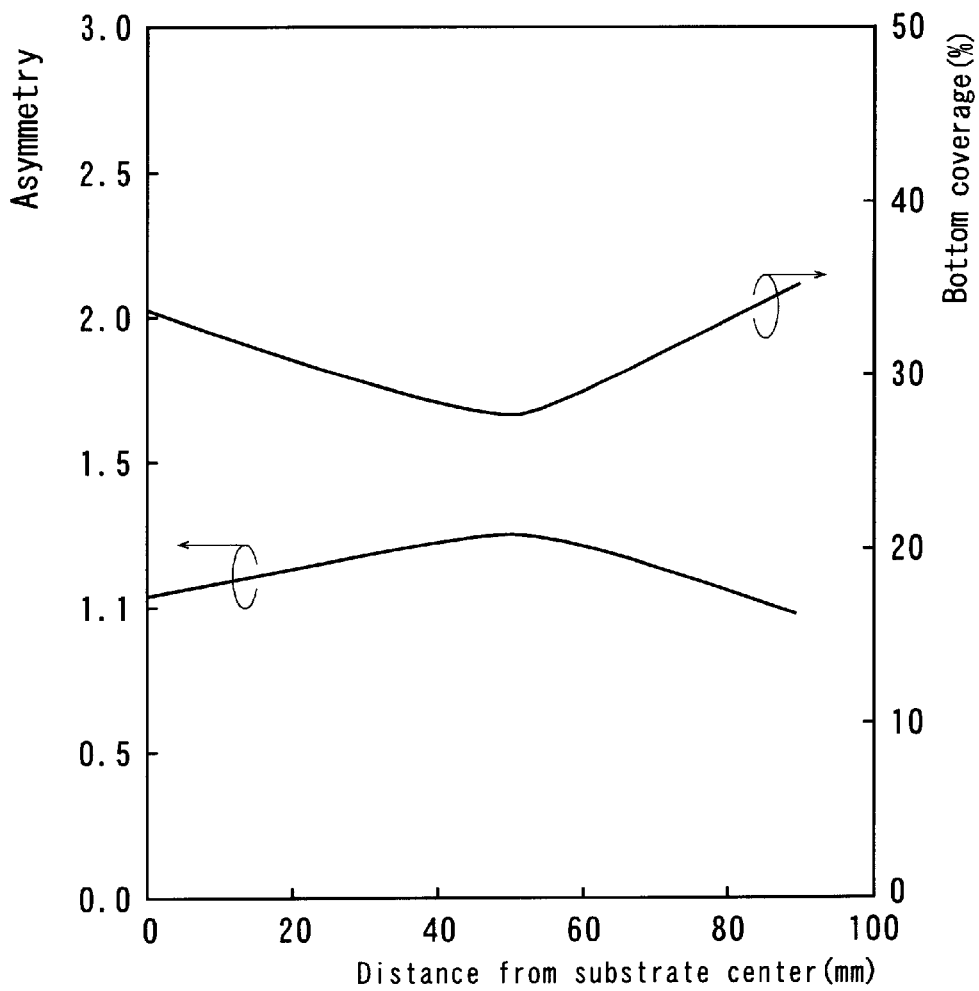
FIG. 8 is a graph showing the relationship between asymmetry and bottom coverage of substrate inplane.

Next, FIG. 8 is a graph showing the relationship between asymmetry A and bottom coverage B of a thin film formed inside microscopic holes made in the surface of the substrate 12 and distance from the center of the substrate, with the solid line representing the case of the present invention. The horizontal axis represents position of the microscopic holes from the center of the substrate 12.

Figure 9:
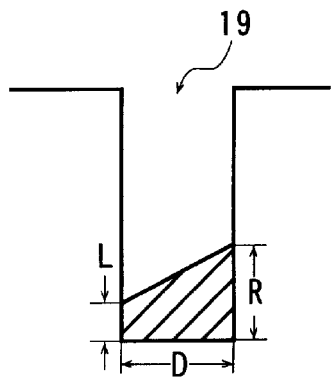
FIG. 9 is a drawing for describing a method of calculating asymmetry and bottom coverage.

Asymmetry A and bottom coverage B in FIG. 8 are calculated from the following equations, in which F is a film thickness on the surface of the substrate where microscopic holes are not formed, and film thickness at two side positions of the thin film formed inside the microscopic holes 19 are respectively L and R, as shown in FIG. 9.

$$A=R/L$$

$$B=((R+L)/2)/F \times 100$$

As will be understood from FIG. 8, with the sputtering device 2 of the present invention, asymmetry of thin film on the surface of the substrate becomes uniformly small and variations in bottom coverage are also small.

Since Ti particles are deposited to the surfaces of the above described shield plates 21–23, it is preferable to remove the plates from the stick preventive tube 25 and clean them before they break off and constitute smallness dust source.

With the above described sputtering device 2 of the present invention, the cathode electrodes $7_1-7_9$, targets $5_1-5_9$ and the first to third shield plates 21–23 are caused to rotate together due to rotation of the target holder 15, but it is also possible to have these part stationary and to rotate the substrate holder 13 so that the substrate 12 rotates with respect to the target holder 15.

Also, the shield assembly 20 of the present invention can be widely used not only in reactive suppering, but also in sputtering devices.

Each of the above described targets $5_1-5_9$ is a flat plate, and they are arranged parallel to a substrate 12 on a substrate holder 13, but the targets of the present invention are not limited to a plate shape.

With the above described sputtering device 2, each of the targets $5_1-5_9$ are arranged above the substrate holder 13, however, the present invention is not limited to such structural arrangement.

With the sputtering device of the present invention, it is possible to uniformly form a thin film inside microscopic holes of high aspect ratio. It is easy to clean the shield plates; and smallness dust is not generated.

Also, since the target surfaces do not deteriorate, even if reactant gas is introduced inside the vacuum chamber, deposition rate can be increased.

What is claimed is:

1. A sputtering device comprising:
   a vacuum chamber;
   a substrate holder arranged inside the vacuum chamber for holding a substrate;
   a plurality of targets arranged with surfaces opposite a substrate on the substrate holder; and
   a plurality of shield plates provided with a plurality of holes and arranged parallel to the surface of the substrate holder and each other between the substrate holder and each of said targets, with spaces maintained between the shield plates,
   wherein each of said targets faces said substrate holder through each of holes in each of said shield plates, and each of said targets and each of said shield plates are rotated relative to said substrate holder while being stationary with respect to each other.

2. The sputtering device according to claim 1, wherein each of said targets having a normal line perpendicular to the surface of each target passes through the holes in each shield plate and reaches the substrate holder.

3. The sputtering device according to claim 1, wherein a cathode electrode in which said target is arranged, having a normal line perpendicular to the surface of cathode electrode passes through the holes in each shield plate and reaches the substrate holder.

4. The sputtering device according to claim 1, wherein each target is arranged above said substrate holder.

5. The sputtering device according to claim 1, wherein each of said targets is fixed to the same target holder.

6. The sputtering device according to claim 1, wherein said vacuum chamber has a first gas inlet for introducing sputtering gas and a second gas inlet for introducing reactant gas, with said first gas inlet being arranged closer to said target than said second gas inlet.

7. The sputtering device according to claim 6, wherein said first gas inlet for introducing sputtering gas is arranged between said target and a shield plate closest to said target, and said second gas inlet for introducing reactant gas between said substrate holder and said shield plate closest to said substrate holder.

8. The sputtering device according to claim 1, further comprising a stick preventive tube arranged between said substrate holder and said target, having one opening section facing said substrate holder side, and another opening section facing said target side, wherein each of the shield plates is arranged inside said stick preventive tube.

9. The sputtering device of claim 8, wherein each of said shield plates is removably attached to said stick preventive tube.

10. The sputtering device according to claim 8, wherein a shield ring is arranged at an outer portion of said stick preventive tube, and a space inside said vacuum chamber is partitioned into a target side and a substrate holder side by said shield ring and said shield plates.

11. The sputtering device according to claim 10, wherein the first inlet for introducing sputtering gas into said vacuum chamber is provided on the target side of said vacuum chamber, and said second inlet for introducing reactant gas into said vacuum chamber is provided on a substrate holder side of said vacuum chamber.

* * * * *